United States Patent
Kuo

(10) Patent No.: US 7,315,096 B2
(45) Date of Patent: Jan. 1, 2008

(54) VOLTAGE REGULATOR CIRCUIT FOR BLADE SERVER

(75) Inventor: Chih-Hung Kuo, Taipei (TW)

(73) Assignee: Inventec Corporation, Taipei (TW)

( * ) Notice: Subject to any disclaimer, the term of this patent is extended or adjusted under 35 U.S.C. 154(b) by 429 days.

(21) Appl. No.: 11/144,649

(22) Filed: Jun. 6, 2005

(65) Prior Publication Data

US 2006/0284491 A1    Dec. 21, 2006

(51) Int. Cl.
*H02J 3/00* (2006.01)
*G06F 1/26* (2006.01)

(52) U.S. Cl. .................. 307/39; 307/116; 713/323

(58) Field of Classification Search ............ 307/31, 307/38, 42, 64, 115, 116; 713/320, 323, 713/324
See application file for complete search history.

(56) References Cited

U.S. PATENT DOCUMENTS

| | | | |
|---|---|---|---|
| 5,191,227 A * | 3/1993 | Deluca et al. ............. | 307/116 |
| 6,768,224 B2 * | 7/2004 | Shen et al. ................ | 307/64 |
| 7,045,914 B2 * | 5/2006 | Liu et al. .................. | 307/116 |
| 7,170,197 B2 * | 1/2007 | Lopata ..................... | 307/70 |

\* cited by examiner

*Primary Examiner*—Jessica Han
(74) *Attorney, Agent, or Firm*—Bacon & Thomas, PLLC

(57) ABSTRACT

The present invention is to provide a voltage regulator circuit disposed on a circuit board of a blade server including a voltage regulator module for converting voltage of a power source and outputting the power source and a switch unit being connected with the voltage regulator module, wherein a standby power source output end disposed between the voltage regulator module and the switch unit is able to continuously output power sources as standby power sources to each of components on the circuit board when the switch unit is opened. When the blade server is turned on and the switch unit is closed, a power source output end of the switch unit will output the power sources as standard powers to each of the components, meanwhile, the standby power source output end is still outputting the standby power sources.

5 Claims, 3 Drawing Sheets

VOLTAGE REGULATOR CIRCUIT FOR BLADE SERVER

FIELD OF THE INVENTION

The present invention relates to blade servers, more particularly to a blade server having a voltage regulator circuit capable of outputting a standard power source and a standby power source simultaneously, or outputting the standby power source only, by utilizing a switch unit thereof.

BACKGROUND OF THE INVENTION

In recent years, the booming advancement of electronics industry and material sciences has successfully developed various types of new electronic products. Not only the manufacturing cost is lower and lower, but also the quality and function of the electronic products are significantly improved. Moreover, the improvement of semiconductor processing technology allows smaller and smaller semiconductor devices to be built, which has dominated the trends and demands of the current market of electronic products. In addition, the function and performance of those electronic products are also enhanced.

Blade server used in the current industry is basically installed in a chassis, which has a thickness of 1 U (1 U=1¾" or 44.45 mm). One feature of the blade server is in that a variety of chipsets, electronic devices, and interface devices are disposed in a limited space of the blade server. Therefore, when designing a blade server, the question of how to use the least amount of chipsets, electronic devices and interface devices so as to achieve higher performance becomes the priority of all other concerns.

Referring to FIG. 1, a conventional voltage regulator circuit for a blade server is illustrated. As shown, the conventional voltage regulator circuit is formed on a circuit board 1 of the blade server. The voltage regulator circuit includes a plurality of standard voltage regulator modules 12 and a plurality of standby voltage regulator modules 14. The voltage regulator modules 12, 14 are connected with a power supply 16 installed on the circuit board 1, which can receive and convert the voltage output from a direct current (DC) high voltage power source. The standard voltage regulator modules 12 can output standard power sources of various voltages to the circuit board 1 when the blade server is turned on. On the other hand, the standby voltage regulator modules 14 can output standby power sources of various voltages to the circuit board 1, regardless of whether the blade server is turned on or is standing by. In this manner, the voltage regulator circuit can provide the chipsets, the electronic devices and the interface devices on the circuit board 1 with either standard power sources or standby power sources.

However, since the chipsets, the electronic devices and the interface devices of the circuit board 1 need power sources of different voltages, a plurality of voltage regulator modules are often installed on the circuit board 1, so as to generate power sources of different voltages for each of the chipsets, the electronic devices and the interface devices. If the power sources needed by some of the chipsets, the electronic devices or the interface devices are divided into the standard power sources and the standby power sources, the circuit board 1 then further requires a plurality of voltage regulator modules. This renders a higher production cost. In addition, it is also more difficult to dispose all these voltage regulator modules 12, 14 in the limited available space of the blade server.

SUMMARY OF THE INVENTION

In light of the drawbacks described above, the inventor of the present invention has dedicated to the study and experimentation of voltage regulator circuits for blade servers, and developed a new voltage regulator circuits for blade servers of the present invention. The voltage regulator circuits of the present invention can reduce the production cost thereof and gain more layout space.

It is an object of the present invention to provide a voltage regulator circuit for a blade server. The voltage regulator circuit of the present invention is disposed on a circuit board, which includes a voltage regulator module that can convert voltage of a power source and output the current output and is connected with a switch unit and a standby power source output end. The standby power source output end is disposed between the voltage regulator module and the switch unit, and can continuously output power sources to each of the chipsets, the electronic devices or the interface devices as a standby power source when the switch unit is opened. On the other hand, when the blade server is turned on and the switch unit is closed, a power source output end of the switch unit will output the power sources to each of the chipsets, the electronic devices or the interface devices as a standard power source. Meanwhile, the standby power source output end is still outputting the standby power sources. In this manner, only one voltage regulator module is needed to simultaneously output the standard power source and the standby power source. The production cost of the blade server is thus reduced and more layout space thereof is obtained.

DETAILED DESCRIPTION OF THE PREFERRED EMBODIMENTS

Figure 2:
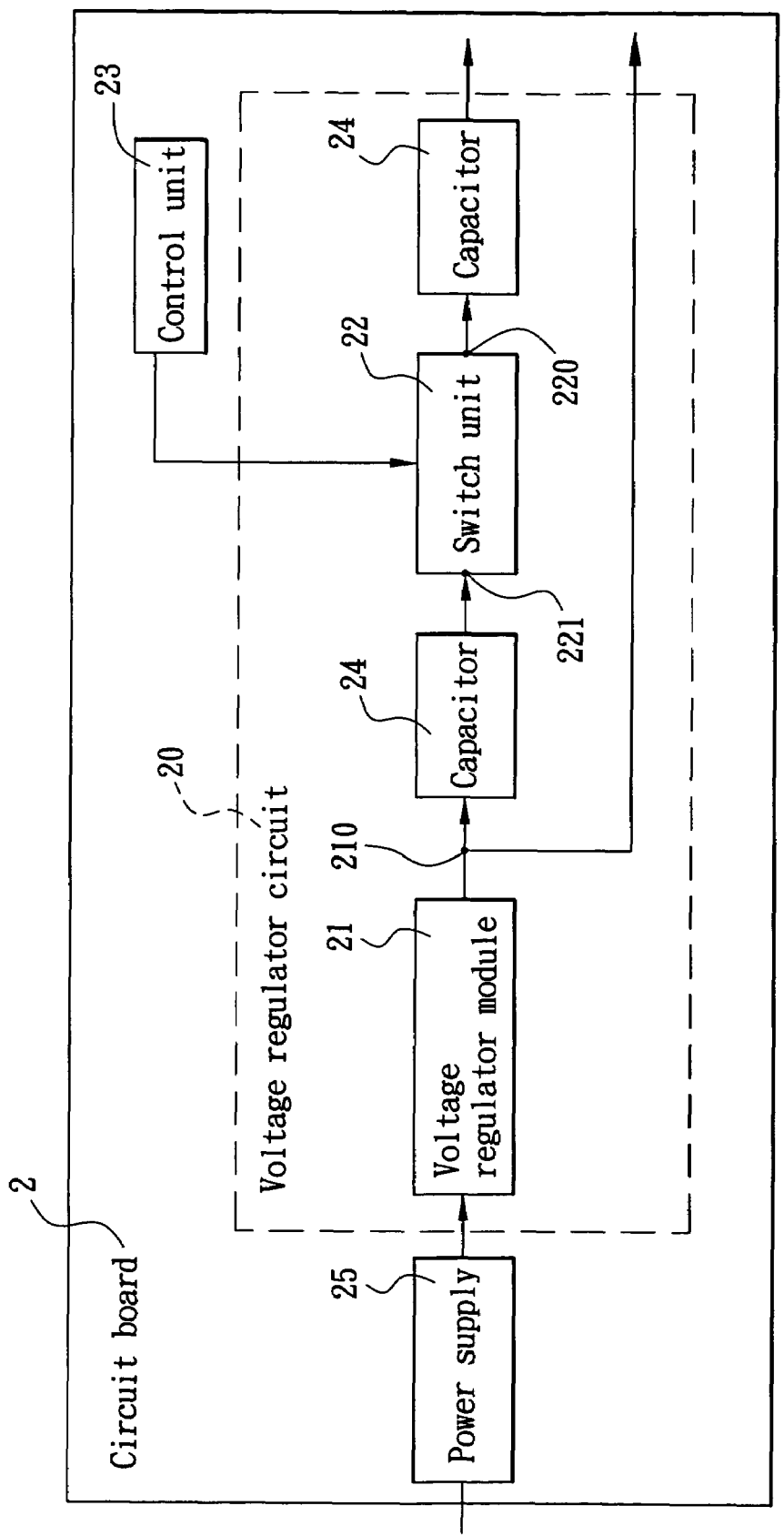
FIG. 2 illustrates a voltage regulator circuit of the present invention.

Referring to FIG. 2, the voltage regulator circuit for a blade server includes a voltage regulator circuit 20 disposed on a circuit board 2 of the blade server. The voltage regulator circuit 20 includes a voltage regulator module (VRM) 21 and a switch unit 22. The voltage regulator module 21 can receive and convert voltage of a power source and output the power source. The switch unit 22 is connected with the voltage regulator module 21. The voltage regulator circuit 20 further includes a standby power source output end 210 disposed between the voltage regulator module 21 and the switch unit 22. The standby power source output end 210 can continuously output the power source before the switch unit 22 is closed, thereby providing a standby power source for the chipsets, the electronic devices or the interface devices on the circuit board 2. When the blade server is turned on and the switch unit 22 is closed, a power source output end 220 of the switch unit 22 will output the power source, thereby providing a standard power source for the chipsets, the electronic devices or the interface devices on the circuit board 2. Meanwhile, the standby power source output end 210 also outputs the standby power source. In this manner, the blade server can simultaneously output the standard power source and the standby power source to each of the chipsets, the electronic devices or the interface devices with only one voltage regulator module 21 installed. The production cost is thus reduced. Furthermore, the circuit board 2 can obtain available space for laying out other circuits or electronic devices thereon.

Referring again to FIG. 2, the switch unit 22 in one embodiment of the present invention is a MOS transistor, which can receive a control signal sent from a control unit 23 on the circuit board 2. When the blade server is not turned on, the switch unit 22 is under an open circuit status. Therefore, the power source output end 220 of the switch unit 22 can not output the standard power source. When the blade server is turned on, the control unit 23 can output the control signal to the switch unit 22, thereby making the switch unit 22 turning to a closed circuit status. The power source is then inputted to a power source input end 221 of the switch unit 22, and outputted to the power source output end 220 for providing the standard power source to each of the chipsets, the electronic devices or the interface devices on the circuit board 2. When the blade server is turned off, the control unit 23 can output the control signal to the switch unit 22. The switch unit 22 is thus no longer closed, thereby terminating the standard power source output from the power source output end 220.

In this particular embodiment, as shown in FIG. 2, at least a capacitor 24 is disposed at the power source output end and/or at a position between the power source input end 221 of the switch unit 22 and the voltage regulator module 21. The existence of the capacitor 24 can prevent the voltage regulator module 21 and the switch unit 22 from burning out due to transient voltage variation during power source input and output. The capacitor 24 can also store electric power that provides stable standard power source for each of the chipsets, the electronic devices or the interface devices on the circuit board 2.

In this particular embodiment, as shown in FIG. 2, the circuit board further includes a power supply 25. The power supply 25 can transmit the power source to the voltage regulator module 21.

Figure 1:
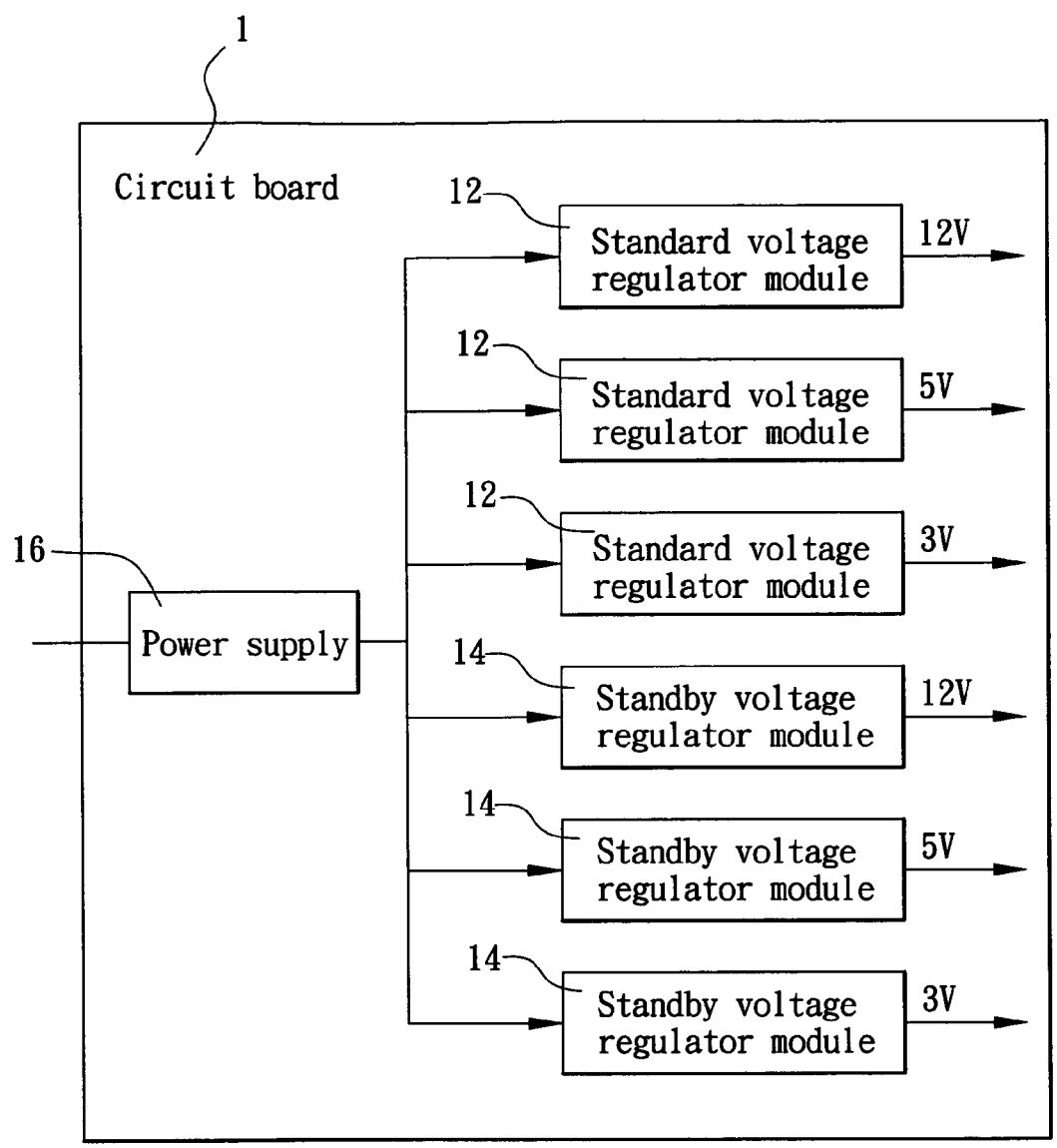
FIG. 1 illustrates a conventional voltage regulator circuit.
Figure 3:
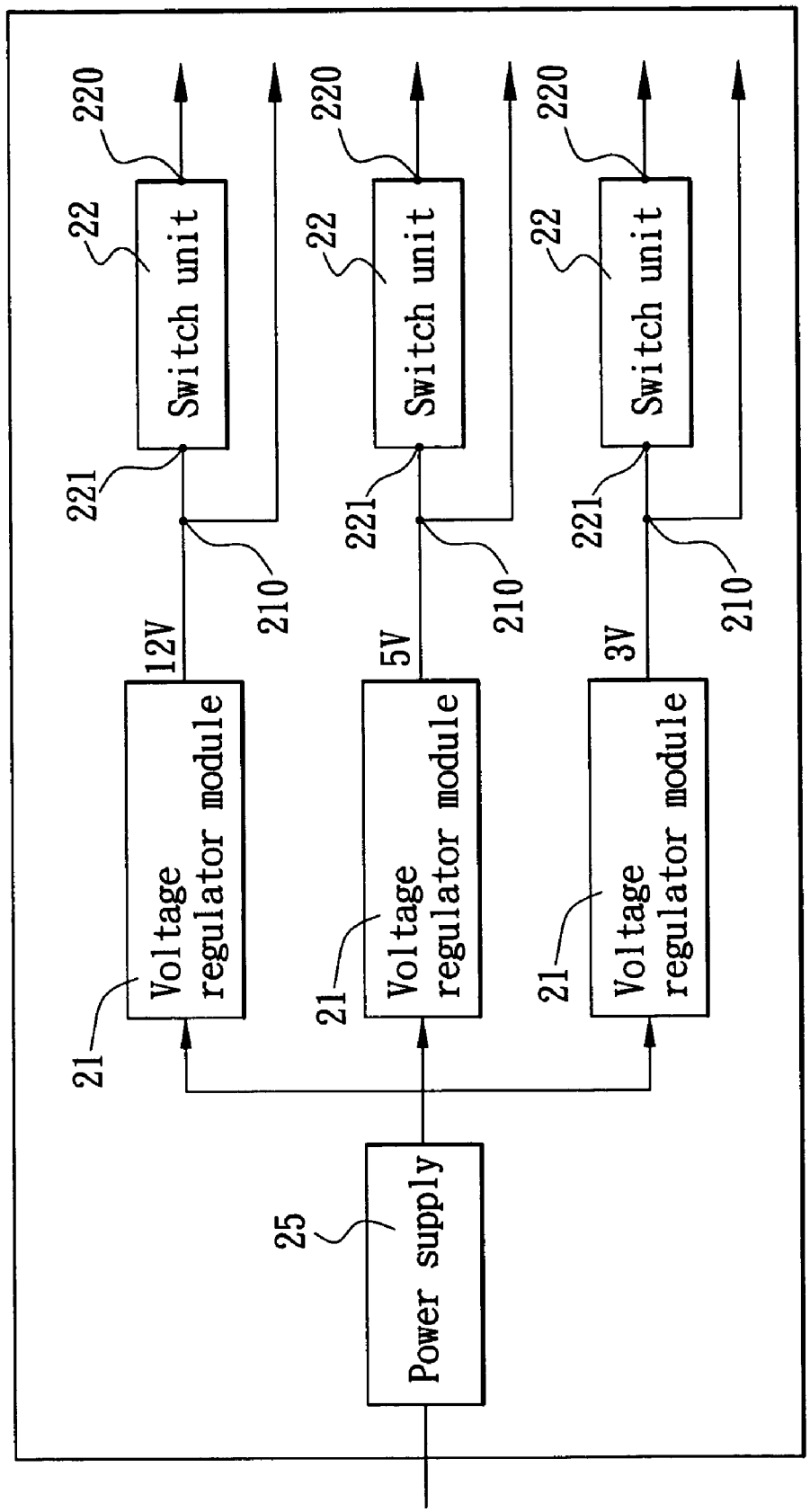
FIG. 3 illustrates the voltage regulator circuit, in accordance with one embodiment of the present invention.

Referring to FIG. 1 and FIG. 3, we can now compare the differences between the voltage regulator circuit of the present invention and the conventional voltage regulator circuit. If a blade server needs standard power source and standby power source of three different voltages: 12 volts, 5 volts and 3 volts, six voltage regulator modules (as shown in FIG. 1) will be required in a conventional voltage regulator circuit. Three of the six voltage regulator modules output the standard power sources of 12 volts, 5 volts and 3 volts, while the other three output the standby power sources of 12 volts, 5 volts and 3 volts. However, the voltage regulator circuit of the present invention requires only three voltage regulator modules 21 and three switch units 22 (as shown in FIG. 3) for outputting the standard power sources and the standby power sources of 12 volts, 5 volts and 3 volts. Therefore, the voltage regulator circuit for blade server of the present invention can solve the problem of having too many voltage regulator modules 21 in the conventional voltage regulator circuit. In addition, the production cost of the voltage regulator circuit is also reduced. Further, since size of the MOS transistor is smaller than the conventional voltage regulator module, more layout space is thus available on the voltage regulator circuit of the present invention.

While the invention has been described by means of specific embodiments, numerous modifications and variations could be made thereto by those skilled in the art without departing from the scope and spirit of the invention set forth in the following claims.

What is claimed is:

1. A voltage regulator circuit for a blade server, which is disposed on a circuit board, comprising:
    a voltage regulator module, which can convert voltage of a power source and then output the power source;
    a switch unit, which is connected with the voltage regulator module, whereby the switch unit can receive the power source when the blade server is turned on and the switch unit is closed, and output the power source via a power source output end of the switch unit for providing a standard power source for chipsets, electronic devices or interface devices on the circuit board;
    a standby power source output end, which is installed between the voltage regulator module and the switch unit, whereby the standby power source output end can receive and continuously output the power source transmitted from the voltage regulator module when the switch unit is opened or when the blade server is turned on and the switch unit is closed for providing a standby power source for the chipsets, the electronic devices or the interface devices on the circuit board.

2. The voltage regulator circuit as recited in claim 1, wherein the circuit board comprises a control unit, whereby the control unit outputs a control signal to the switch unit for turning the switch unit into a closed circuit status when the blade server is turned on, or turning the switch unit into an open circuit status when the blade server is turned off.

3. The voltage regulator circuit as recited in claim 1, wherein the switch unit further comprises a power source input end, whereby the power source input end can receive the power source and output the standard power source to the power source output end when the switch unit is closed.

4. The voltage regulator circuit as recited in claim 3, further comprising at least a capacitor disposed at the power source output end or at a position between the power source input end and the standby power source output end.

5. The voltage regulator circuit as recited in claim 1, wherein the circuit board further comprises a power supply, whereby the power supply can transmit power source to the voltage regulator module.

* * * * *